(12) United States Patent
Seki et al.

(10) Patent No.: US 8,426,949 B2
(45) Date of Patent: Apr. 23, 2013

(54) MESA TYPE SEMICONDUCTOR DEVICE

(75) Inventors: Katsuyuki Seki, Ojiya (JP); Akira Suzuki, Ota (JP); Keita Odajima, Fukaya (JP)

(73) Assignees: SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 100 days.

(21) Appl. No.: 12/354,620

(22) Filed: Jan. 15, 2009

(65) Prior Publication Data

US 2009/0189257 A1 Jul. 30, 2009

(30) Foreign Application Priority Data

Jan. 29, 2008 (JP) ................................. 2008-017849

(51) Int. Cl.
*H01L 29/06* (2006.01)

(52) U.S. Cl.
USPC ............... 257/622; 257/623; 257/E29.329

(58) Field of Classification Search .................. 257/496, 257/586, 618, 623–626, E29.329
See application file for complete search history.

(56) References Cited

U.S. PATENT DOCUMENTS

| | | | |
|---|---|---|---|
| 4,040,084 A * | 8/1977 | Tanaka et al. ................. | 257/496 |
| 4,227,975 A | 10/1980 | Hartman et al. | |
| 4,656,497 A | 4/1987 | Rogers et al. | |
| 4,824,797 A | 4/1989 | Goth | |
| 4,974,050 A | 11/1990 | Fuchs | |
| 5,313,092 A * | 5/1994 | Tsuruta et al. ................. | 257/620 |
| 5,726,086 A | 3/1998 | Wu | |
| 5,726,088 A | 3/1998 | Yanagiya et al. | |
| 5,882,986 A | 3/1999 | Eng et al. | |
| 6,127,720 A | 10/2000 | Nakura et al. | |

(Continued)

FOREIGN PATENT DOCUMENTS

| | | |
|---|---|---|
| JP | 62-46534 | 2/1987 |
| JP | 2-44729 | 2/1990 |

(Continued)

OTHER PUBLICATIONS

Suzuki, U.S. Office Action mailed Nov. 30, 2010, directed to U.S. Appl. No. 12/338,694; 10 pages.

(Continued)

*Primary Examiner* — Tucker Wright
(74) *Attorney, Agent, or Firm* — Morrison & Foerster LLP (57) ABSTRACT

A mesa type semiconductor device and its manufacturing method are offered to increase a withstand voltage as well as reducing a leakage current. An $N^-$-type semiconductor layer is formed on a surface of a semiconductor substrate, and a P-type semiconductor layer is formed on the $N^-$-type semiconductor layer. After that, a mesa groove is formed by etching the P-type semiconductor layer, a PN junction, the $N^-$-type semiconductor layer and a partial thickness of the semiconductor substrate so that a width of the mesa groove grows from a surface of the P-type semiconductor layer toward the semiconductor substrate. Subsequent wet etching removes a damaged layer in an inner wall of the mesa groove caused by the preceding etching and transforms the mesa groove in a region close to a surface of the P-type semiconductor layer so that a width of the mesa groove increases toward the surface of the P-type semiconductor layer. After that, the semiconductor substrate and the layers stacked on it are diced.

4 Claims, 6 Drawing Sheets

U.S. PATENT DOCUMENTS

| | | |
|---|---|---|
| 6,521,538 B2 | 2/2003 | Soga et al. |
| 6,787,848 B2 | 9/2004 | Ono et al. |
| 6,831,367 B2 | 12/2004 | Sekine |
| 7,129,112 B2 | 10/2006 | Matsuo |
| 7,380,915 B2 | 6/2008 | Terui |
| 7,498,661 B2 | 3/2009 | Matsuo |
| 7,646,015 B2 | 1/2010 | Fujii et al. |
| 7,741,192 B2 | 6/2010 | Shimoyama et al. |
| 7,776,672 B2 | 8/2010 | Nakazawa et al. |
| 2003/0116532 A1 | 6/2003 | Goldbach et al. |
| 2009/0160034 A1 | 6/2009 | Suzuki et al. |
| 2009/0160035 A1 | 6/2009 | Suzuki et al. |

FOREIGN PATENT DOCUMENTS

| | | |
|---|---|---|
| JP | 2002-134523 | 5/2002 |
| JP | 2003-124478 | 4/2003 |
| JP | 2003-347306 | 12/2003 |
| JP | 2004-296488 | 10/2004 |
| JP | 2005-51111 | 2/2005 |
| JP | 2005-276877 | 10/2005 |
| JP | 2006-12889 | 1/2006 |
| JP | 2006-156926 | 6/2006 |
| JP | 2006-287118 | 10/2006 |
| JP | 2006-310672 | 11/2006 |
| JP | 2007-180303 | 7/2007 |
| JP | 2007-207796 | 8/2007 |
| JP | 2007-305906 | 11/2007 |
| JP | 2008-10608 | 1/2008 |
| KR | 1999-003500 | 1/1999 |
| KR | 10-2003-0003089 | 1/2003 |
| TW | 417190 | 1/2001 |
| TW | 200415796 | 8/2004 |
| TW | I237343 | 8/2005 |
| TW | I266367 | 11/2006 |
| TW | I281442 | 5/2007 |
| WO | WO-03/077306 | 9/2003 |

OTHER PUBLICATIONS

Suzuki, U.S. Office Action mailed Nov. 30, 2010, directed to U.S. Appl. No. 12/338,686; 7 pages.

Suzuki A., et al., U.S. Office Action mailed Apr. 12, 2011, directed to U.S. Appl. No. 12/338,694; 13 pages.

Suzuki, U.S. Office Action mailed Aug. 5, 2011, directed to U.S. Appl. No. 12/338,694; 14 pages.

Suzuki, A. et al., U.S. Office Action mailed Nov. 22, 2011, directed to U.S. Appl. No. 12/338,694; 6 pages.

* cited by examiner

MESA TYPE SEMICONDUCTOR DEVICE

CROSS-REFERENCE OF THE INVENTION

This application claims priority from Japanese Patent Application No. 2008-017849, the content of which is incorporated herein by reference in its entirety.

BACKGROUND OF THE INVENTION

1. Field of the Invention

This invention relates to a mesa type semiconductor device having a mesa groove and its manufacturing method.

2. Description of the Related Art

A mesa type power diode has been known as one of the mesa type semiconductor devices. A mesa type diode according to a prior art is described referring to FIG. 9.

Figure 9:
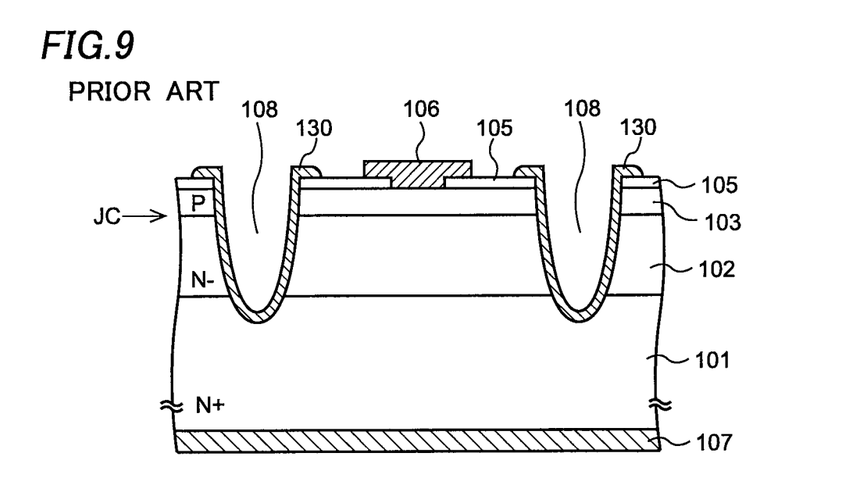
FIG. 9 is a cross-sectional view showing a mesa type diode according to a prior art.

An $N^-$-type semiconductor layer 102 is formed on a surface of an $N^+$-type semiconductor substrate 101. An insulation film 105 is formed on a P-type semiconductor layer 103 that is formed on a surface of the $N^-$-type semiconductor layer 102. Also, an anode 106 electrically connected with the P-type semiconductor layer 103 is formed.

There is formed a mesa groove 108 that extends from a surface of the P-type semiconductor layer 103 to the $N^+$-type semiconductor substrate 101. The mesa groove 108 penetrates through the $N^-$-type semiconductor layer 102 and its bottom is located inside the $N^+$-type semiconductor substrate 101. Sidewalls of the mesa groove 108 are tapered down to the bottom of the mesa groove 108 to have a normal tapered shape. The mesa type diode is surrounded by the mesa groove 108 to have a mesa type structure.

A passivation film 130 is formed to cover the sidewalls of the mesa groove 108, and a cathode 107 is formed on a back surface of the semiconductor substrate 101.

The mesa type semiconductor device is described in Japanese Patent Application Publication No. 2003-347306, for example.

However, experiments conducted by the inventors showed that the mesa type diode according to the prior art did not have a high enough withstand voltage when it was reverse biased. It is considered that the withstand voltage is reduced by an electric field convergence at a PN junction JC under the reverse bias, which is caused because the sidewalls of the mesa groove 108 around the PN junction JC have the normal tapered shape.

The inventors have found that the withstand voltage could be improved by forming the sidewalls of the mesa groove 108 vertical to the surface of the semiconductor substrate 101. It is conceivable that a Bosch process, which is a dry etch process capable of forming a high aspect ratio structure, is used to form the vertical sidewalls of the mesa groove 108.

When the Bosch process is used, however, a damaged layer is formed in the sidewall of the mesa groove 108. The damaged layer causes a leakage current when the reverse bias is applied to the mesa type diode. The damaged layer can be removed by wet etching. However, the wet etching transforms the sidewalls of the mesa groove 108 around the PN junction JC into the normal tapered shape as in the prior art shown in FIG. 9, and the withstand voltage is reduced.

SUMMARY OF THE INVENTION

The invention provides a method of manufacturing a mesa type semiconductor device. The method includes providing a semiconductor substrate of a first general conductivity type, forming a first semiconductor layer of the first general conductivity type on the surface of the semiconductor substrate so as to have an impurity concentration lower than an impurity concentration of the semiconductor substrate, forming a second semiconductor layer of a second general conductivity type on the surface of the first semiconductor layer, and forming by a first etching a mesa groove so as to define a mesa structure. The mesa groove extends from the surface of the second semiconductor layer and reaches the semiconductor substrate so as to taper from the bottom of the mesa groove toward the top of the mesa groove. The method also includes removing by a second etching a damaged layer formed in an inner wall of the mesa groove by the first etching.

The invention also provides a mesa type semiconductor device that includes a semiconductor substrate of a first general conductivity type, and a first semiconductor layer of the first general conductivity type disposed on the surface of the semiconductor substrate. The impurity concentration of the first semiconductor layer is lower than the impurity concentration of the semiconductor substrate. The device also includes a second semiconductor layer of a second general conductivity type disposed on the surface of the first semiconductor layer so as to form a PN junction between the first semiconductor layer and the second semiconductor layer, and an edge portion including a first edge portion disposed above the PN junction and a second edge portion extending from the first edge portion and covering an edge of the PN junction. The first edge portion and the second edge portion slant in different directions so that the portion connecting the first and second edge portions extrudes the farthest laterally at the first and second edge portions.

DETAILED DESCRIPTION OF THE INVENTION

A mesa type semiconductor device and its manufacturing method according to an embodiment of this invention are described taking an example where the mesa type semiconductor device is a mesa type diode. FIGS. 1-4D and FIGS. 6-8 are cross-sectional views showing the mesa type diode and its manufacturing method according to the embodiment. FIGS. 5A and 5B are plan views showing the mesa type diode and its manufacturing method according to the embodiment.

Note that the manufacturing method of the mesa type diode described below is applied to a semiconductor substrate in a wafer form on which a plurality of the mesa type diodes is to be arrayed in a matrix form. Only one of the mesa type diodes on the semiconductor substrate in the wafer form is shown in FIGS. 1-4D and FIGS. 6-8, for the sake of convenience.

Figure 1:
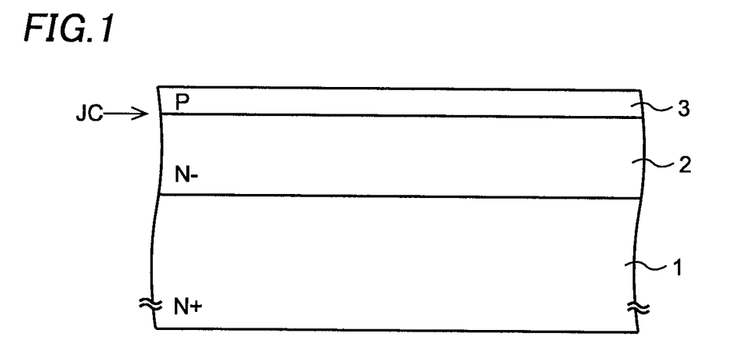
FIG. 1 is a cross-sectional view showing a mesa type diode and its manufacturing method according to an embodiment of this invention.

There is provided an N$^+$-type semiconductor substrate 1 (a single crystalline silicon substrate, for example) that is doped with high concentration N-type impurities such as phosphorus, as shown in FIG. 1. An N$^-$-type semiconductor layer 2 that is an N-type semiconductor layer with a low impurity concentration is formed on a surface of the semiconductor substrate 1 by epitaxial growth. The N$^-$-type semiconductor layer 2 may be replaced with an impurity diffusion region formed by diffusing impurities in the surface of the semiconductor substrate 1, instead of the one described above. After that, a P-type semiconductor layer 3 is formed on a surface of the N$^-$-type semiconductor layer 2 by diffusing P-type impurities such as boron. As a result, a PN junction JC is formed at an interface between the N$^-$-type semiconductor layer 2 and the P-type semiconductor layer 3. In the structure described above, the thickness of stack of the semiconductor substrate 1, the N$^-$-type semiconductor layer 2 and the P-type semiconductor layer 3 is approximately 200 µm, for example. It is noted that conductivity types such as N$^+$, N and N$^-$ belong in a general conductivity type, and conductivity types such as P$^+$, P and P$^-$ belong in another general conductivity type.

Figure 2:
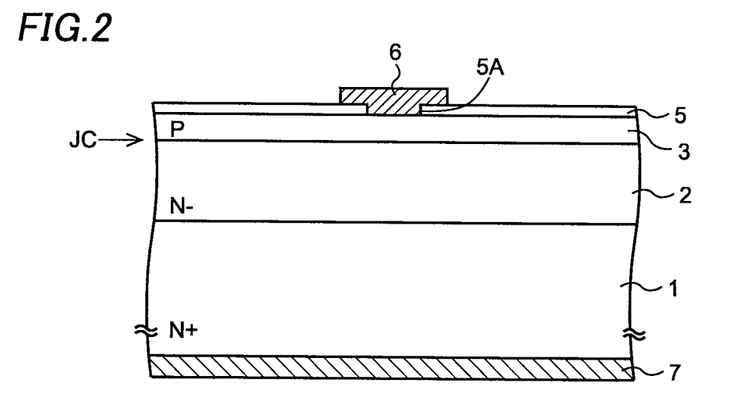
FIG. 2 is a cross-sectional view showing the mesa type diode and its manufacturing method according to the embodiment of this invention.

Next, an insulation film 5 such as a silicon oxide film is formed on a surface of the P-type semiconductor layer 3 by a thermal oxidation method or a CVD (Chemical Vapor Deposition) method, as shown in FIG. 2. After that, a portion of the insulation film 5 is removed by etching to provide the insulation film 5 with an opening 5A that exposes a portion of the P-type semiconductor layer 3. Next, there is formed an anode 6 that is connected with the P-type semiconductor layer 3 through the opening 5A in the insulation film 5. The anode 6 is made of a conductive material such as aluminum, and is formed by a sputtering method, a vapor deposition method or the like. On the other hand, a cathode 7 made of a conductive material such as aluminum is formed on a back surface of the semiconductor substrate 1 by a method similar to the one used in forming the anode 6.

Figure 3:
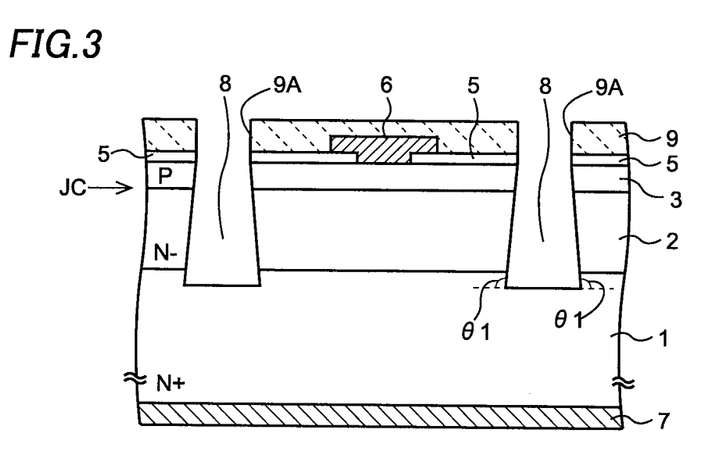
FIG. 3 is a cross-sectional view showing the mesa type diode and its manufacturing method according to the embodiment of this invention.

Next, a resist layer 9 having an opening 9A in a region where a mesa groove 8 is to be formed is formed on the insulation film 5, as shown in FIG. 3. The insulation film 5 is selectively etched off using the resist layer 9 as a mask, and then the P-type semiconductor layer 3, the N$^-$-type semiconductor layer 2 and a partial thickness of the semiconductor substrate 1 are selectively etched off by performing the Bosch process under particular conditions to form the mesa groove 8. With the Bosch process, the mesa groove 8 is formed to have a width that increases from a smaller width at the surface of the P-type semiconductor layer 3 toward a larger width at the semiconductor substrate 1.

The mesa groove 8 penetrates through the N$^-$-type semiconductor layer 2 and its bottom reaches inside the semiconductor substrate 1. Its total depth is preferably about 100 µm. The mesa groove 8 is formed so as to surround the mesa type diode and its sidewalls have a reverse tapered shape. An angle θ1 of the sidewall of the mesa groove 8 against the bottom of the mesa groove 8 is greater than 90 degrees, and is preferably in a range of 90 to 95 degrees.

Forming of the mesa groove 8 by the Bosch process is hereafter described in detail referring to FIGS. 4A-4D. The Bosch process is made of repetition of an etching step that is to perform an isotropic dry etching and a protection film forming step that is to form a protection film on sidewalls of a groove formed by the isotropic dry etching. In this embodiment, duration of the isotropic dry etching is increased every time the etching step and the protection film forming step are repeated.

Figure 4A:
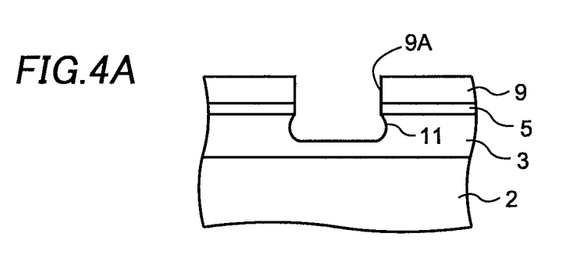
FIGS. 4A-4D are cross-sectional views showing the mesa type diode and its manufacturing method according to the embodiment of this invention.
Figure 5A:
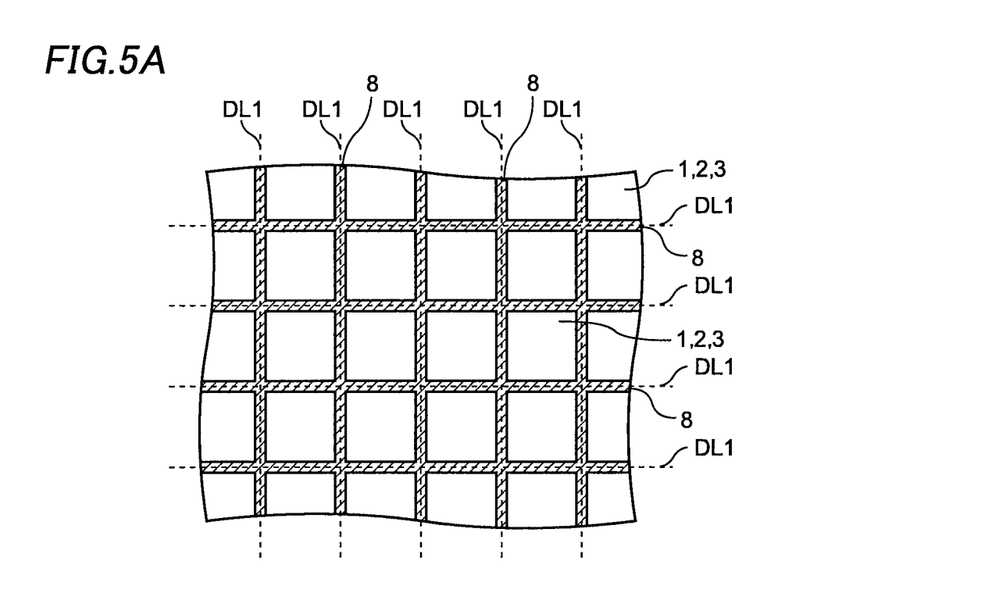
FIGS. 5A and 5B are plan views showing the mesa type diode and its manufacturing method according to the embodiment of this invention.
Figure 5B:
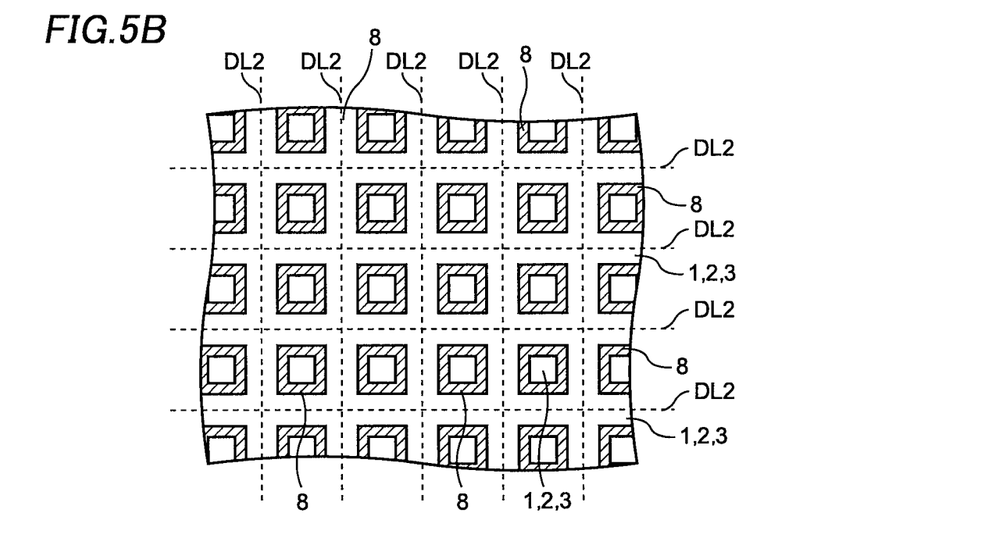

In the etching step, the isotropic dry etching is applied to the P-type semiconductor layer 3 using the resist layer 9 as a mask to form a groove 11 in the P-type semiconductor layer 3, as shown in FIG. 4A. When the P-type semiconductor layer 3 is made of silicon, an etching gas including SF$_6$, for example, is used in the isotropic dry etching.

Figure 4B:
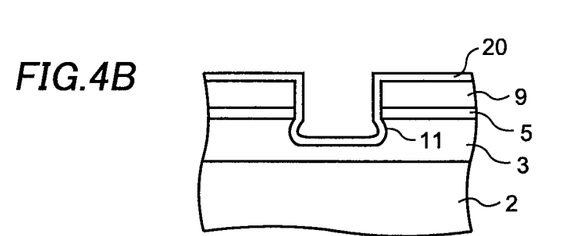

In the subsequent protection film forming step, there is formed a protection film 20 that covers sidewalls and a bottom of the groove 11 and the resist layer 9, as shown in FIG. 4B. The protection film 20 is formed by a CVD method to deposit carbon polymers using an etching gas including C$_4$F$_8$, for example.

Figure 4C:
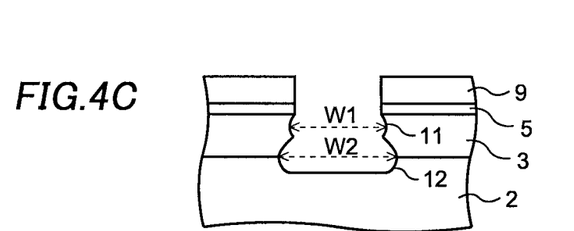

Next, the etching step, that is the isotropic dry etching, is performed again so that the protection film 20 at the bottom of the groove 11 is removed by ion bombardment and the P-type semiconductor layer 3 at the bottom and the underlying N$^-$-type semiconductor layer 2 are removed, as shown in FIG. 4C. However, this time of the isotropic dry etching is performed for a longer period of time than the preceding one. As a result, there is formed a groove 12 having a width W2 that is greater than a width W1 of the groove 11 formed by the preceding isotropic dry etching. After that, the protection film forming step is performed again.

Figure 4D:
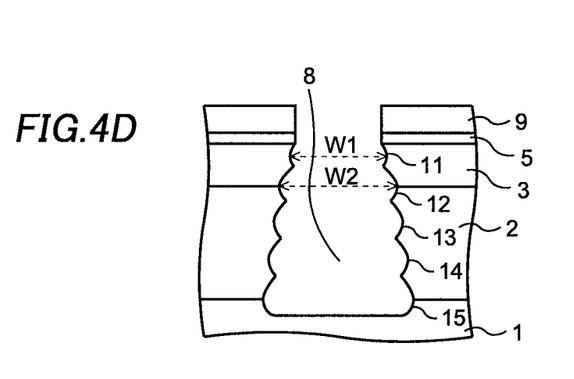

By repeating the etching step and the protection film forming step described above, there are formed grooves 11, 12, . . . 15 having widths gradually growing toward the semiconductor substrate 1 so that a mesa groove 8 having a reverse tapered sidewalls is formed, as shown in FIG. 4D. The angle θ1 of the sidewall of the mesa groove 8, which is defined in this case as an intersecting angle between a line connecting a top edge and a bottom edge of the sidewall of the mesa groove 8 and a line parallel to the bottom of the mesa groove 8, can be adjusted by varying the duration of the etching.

Experiments conducted by the inventors showed that the angle θ1 of the sidewall of the mesa groove 8 was 90 degrees and did not form the reverse tapered sidewalls in some cases when the Bosch process was carried out at a pressure of 50 mTorr. Thus, in order to avoid the case described above, the Bosch process is carried out at a pressure lower than 50 mTorr in the embodiment. For example, the angle θ1 of the sidewall of the mesa groove 8 becomes 92 degrees and the reverse tapered sidewalls are obtained by carrying out the Bosch process at a pressure of 25 mTorr. The Bosch process may be carried out at a pressure as low as 5 mTorr, for example, although it depends on various processing conditions and capabilities of an apparatus used in the process.

It should be noted that the etching step and the protection film forming step are repeated a greater number of times in an actual application of the Bosch process than the number of times shown in FIG. 4D. Also, it should be noted that projections and depressions on the sidewalls of the mesa groove 8 are drawn exaggerated in FIGS. 4A-4D in order to make it easier to understand features of the invention.

To describe a floor plan of the mesa grooves 8, the mesa grooves 8 may be formed along each of scribe lines DL1 as shown in FIG. 5A, or each of the mesa grooves 8 may be formed to surround a mesa diode in each of regions surrounded by intersecting scribe lines DL2 as shown in FIG. 5B.

It should be noted that the mesa groove 8 having reverse tapered sidewalls may be formed by other processes different from the process described above. For example, in the Bosch process described above, duration of the protection film forming step may be increased every time the etching step and the protection film forming step are repeated while the duration of the isotropic dry etching step is unchanged.

Or, the mesa groove 8 having the reverse tapered sidewalls as described above may be formed by applying anisotropic dry etching to the P-type semiconductor layer 3, the N$^-$-type semiconductor layer 2 and the semiconductor substrate 1 in a chamber at a pressure between 15 mTorr and 50 mTorr, for example.

When the isotropic dry etching in the Bosch process or the anisotropic dry etching under the reduced pressure is performed, there is formed a damaged layer in an inner wall (that is made of the sidewalls and the bottom) of the mesa groove 8. Thus, the damaged layer is removed by performing wet etching on the inner wall of the mesa groove 8 using the resist layer 9 as a mask. A chemical solution containing hydrofluoric acid, for example, is used as an etchant in the wet etching.

Figure 6:
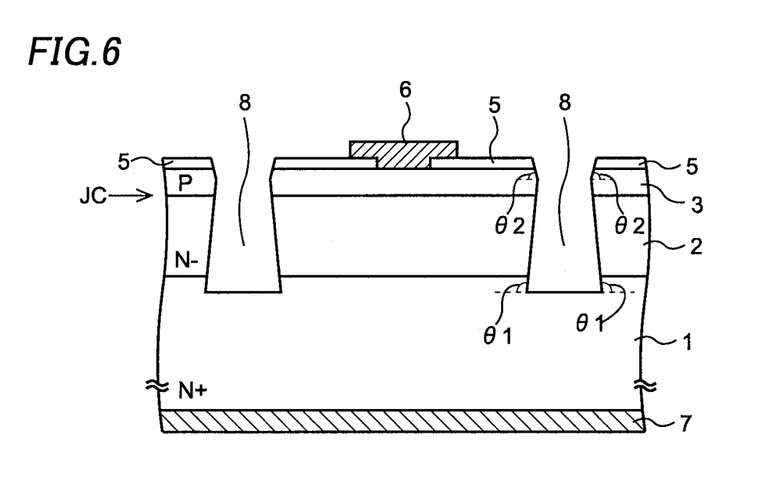
FIG. 6 is a cross-sectional view showing the mesa type diode and its manufacturing method according to the embodiment of this invention.

During this wet etching, an upper portion of the mesa groove 8 is formed to have a width growing from a portion above the PN junction JC toward the surface of the P-type semiconductor layer 3. That is, the sidewalls of the upper portion of the mesa groove 8 are formed into a normal tapered shape, as shown in FIG. 6. An angle θ2 of the upper portion of the sidewall of the mesa groove 8 against a plane parallel to the surface of the P-type semiconductor layer 3 is smaller than 90 degrees and is preferably 80 degrees. Below the upper portion of the mesa groove 8 which is formed to have the normal tapered sidewalls, a lower portion of the mesa groove 8 is left to have the reverse tapered sidewalls. The duration of the wet etching is controlled so that the mesa groove 8 keeps the reverse tapered sidewalls in the lower portion, particularly around the PN junction JC which strongly influences the withstand voltage.

As a result, with the mesa type diode according to the embodiment, the withstand voltage under the reverse bias can be increased when the reverse bias is applied across the PN junction JC, that is, when a high voltage with respect to the anode 6 is applied to the cathode 7, while the leakage current under the reverse bias can be reduced by removing the damaged layer.

Figure 7:
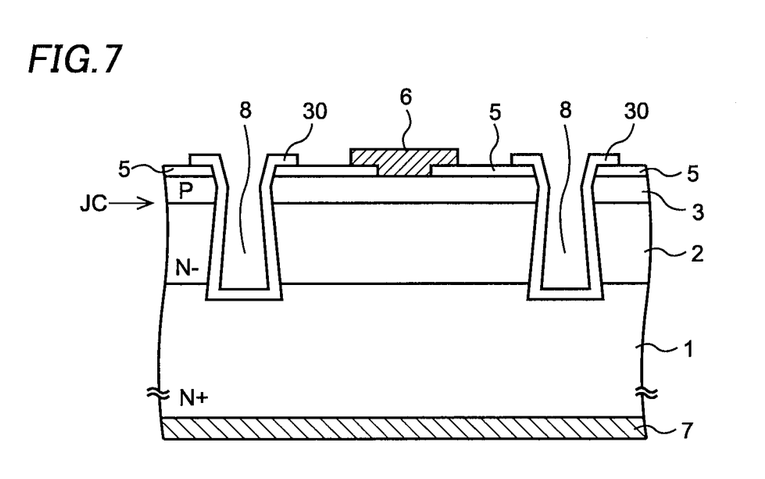
FIG. 7 is a cross-sectional view showing the mesa type diode and its manufacturing method according to the embodiment of this invention.

Next, there is formed a passivation film 30 that covers the inner wall of the mesa groove 8 and extends from the mesa groove 8 onto a portion of the insulation film 5, as shown in FIG. 7. The passivation film 30 completely prevents the P-type semiconductor layer 3, the N$^-$-type semiconductor layer 2 and a portion of the semiconductor substrate 1 from being exposed in the mesa groove 8 and suppresses the leakage current of the mesa type diode more securely.

The insulation film 30 is preferably made of a highly insulative material having a viscosity, at the time of its application, enough to stick to and cover the mesa groove 8, i.e., 100-150 Pa·s. The passivation film 30 is made of a polyimide resin, a glass paste including lead glass powder or zinc glass powder and a resin, for example. The passivation film 30 is formed by a screen printing method, a dispensing method, a spin coating method or a spray coating method, for example. Since the upper portion of the mesa groove 8 close to the surface of the P-type semiconductor layer 3 has the normal tapered shape as described above, the material to make the passivation film 30 smoothly goes into the mesa groove 8.

Therefore, it is made possible that the passivation film 30 uniformly coats the mesa groove 8 with good covering ability. As a result, failures derived from poor covering ability of the passivation film 30 such as occurrence of cracks in the passivation film 30 by a mechanical stress, invasion of moisture or dust, occurrence of a local leakage current and reduction in the withstand voltage can be prevented.

The passivation film 30 may be made of an insulation film such as a silicon nitride film formed by the CVD method or the like. In this case, the passivation film 30 can be also formed to have good covering ability since the upper portion of the mesa groove 8 close to the surface of the P-type semiconductor layer 3 has the normal tapered shape.

Figure 8:
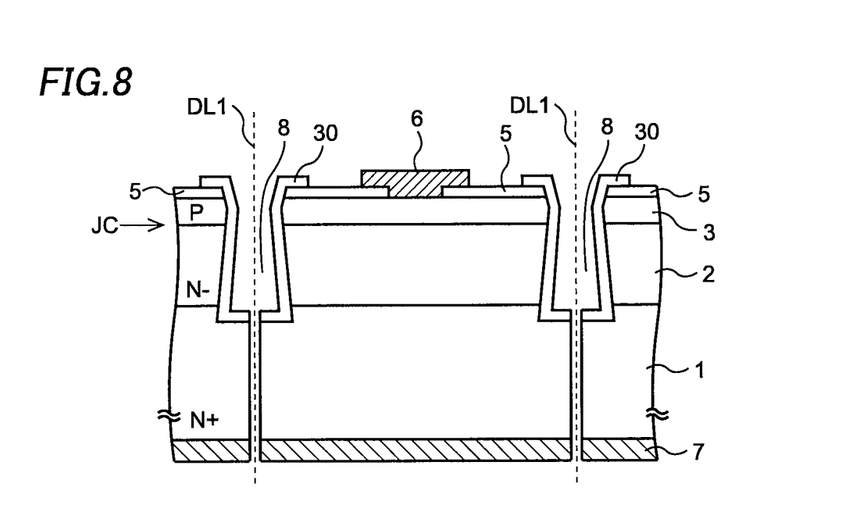
FIG. 8 is a cross-sectional view showing the mesa type diode and its manufacturing method according to the embodiment of this invention.

Next, the semiconductor substrate 1 and the stacked layers on it are diced along the scribe lines DL1 or DL2, and divided into a plurality of mesa type diodes. When the dicing is carried out along the scribe lines DL1 shown in FIG. 5A, the semiconductor substrate 1 is cut along approximately a center of the bottom of the mesa groove 8, as shown in FIG. 8. In this case, the semiconductor substrate 1 and the stacked layers on it are separated into the mesa type diodes so that the mesa grooves 8 make borders between the diodes. That is, a sidewall of the mesa type diode is made of edges of the N$^-$-type semiconductor layer 2 and the P-type semiconductor layer 3. Therefore, a die size of the mesa type diode can be minimized since the die size becomes equivalent to an active region of the mesa type diode.

When the dicing is carried out along the scribe lines DL2 shown in FIG. 5B, on the other hand, the damage such as cracks in the passivation film 30 can be suppressed because a stress caused by contact with a dicing blade or the like is not imposed on the passivation film 30 covering the mesa groove 8. The suppression of the damage is particularly effective when the passivation film 30 includes a glass material of high hardness.

With the mesa type diode completed as described above, the withstand voltage under the reverse bias can be increased, while the leakage current under the reverse bias is reduced because the damaged layer is removed as described above. The withstand voltage as high as approximately 1200 V was obtained. On the other hand, the withstand voltage of the conventional mesa type diode with the mesa groove in the normal tapered shape measured approximately 800 V. The withstand voltage of the mesa type diode with the mesa groove having the vertical sidewalls measured approximately 1000 V.

With the manufacturing method of the mesa type diode according to the embodiment of this invention, the mesa type diode can be reduced in size because the mesa groove 8 is formed to have a high aspect ratio. Since the number of mesa type diodes obtained from a wafer form of the semiconductor substrate 1 can be increase as a result, a cost of manufacturing the mesa type diode can be reduced.

It is apparent that this invention is not limited to the embodiment described above and may be modified within the scope of the invention. For example, the conductivity types of the N$^+$-type semiconductor substrate 1, the N$^-$-type semiconductor layer 2 and the P-type semiconductor layer 3 described in the embodiment may be reversed. Also, although the mesa type diode is explained as an example in the embodiment described above, this invention may be applied to other mesa type semiconductor devices. For example, this invention may be applied to a mesa type bipolar transistor, a mesa type MOSFET (Metal Oxide Semiconductor Field Effect Transistor), a mesa type IGBT (Insulated Gate Bipolar Transistor) and a mesa type thyristor. In the case of the mesa type bipolar transistor, for example, an NPN type bipolar transistor structure can be obtained by providing an additional N-type semiconductor layer on the surface of the P-type semiconductor layer 3.

With the mesa type semiconductor device and its manufacturing method according to the embodiment of this invention, the withstand voltage can be increased as well as reducing the leakage current.

What is claimed is:

1. A mesa type semiconductor device comprising:
   a semiconductor substrate of a first general conductivity type;
   a first semiconductor layer of the first general conductivity type disposed on a surface of the semiconductor substrate, an impurity concentration of the first semiconductor layer being lower than an impurity concentration of the semiconductor substrate;
   a second semiconductor layer of a second general conductivity type disposed on a surface of the first semiconductor layer so as to form a PN junction between the first semiconductor layer and the second semiconductor layer; and
   an exterior sidewall portion comprising a first exterior sidewall portion disposed above the PN junction and a second exterior sidewall portion extending from the first exterior sidewall portion and covering an edge of the PN junction, the first exterior sidewall portion and the second exterior sidewall portion slanting in different directions so that a portion connecting the first and second exterior sidewall portions extrudes the farthest, at the exterior sidewall portion, in a direction parallel to the surface of the semiconductor substrate on which the first semiconductor layer is disposed, the first exterior sidewall portion and the second exterior sidewall portion slanting with respect to a direction perpendicular to the surface of the semiconductor substrate on which the first semiconductor layer is disposed, and the exterior sidewall portion defining an edge of the mesa type semiconductor device in plan view of the semiconductor device.

2. The mesa type semiconductor device of claim 1, wherein the second exterior sidewall portion comprises an exterior sidewall of the first semiconductor layer and part of an exterior sidewall of the semiconductor substrate.

3. The mesa type semiconductor device of claim 1, further comprising a passivation film covering the exterior sidewall portion.

4. The mesa type semiconductor device of claim 1, wherein the first exterior sidewall portion is disposed above the second exterior sidewall portion with respect to the perpendicular direction.

* * * * *